(12) United States Patent
Husung

(10) Patent No.: US 11,622,204 B2
(45) Date of Patent: Apr. 4, 2023

(54) HEARING DEVICE AND HEARING DEVICE MODULE

(71) Applicant: SIVANTOS PTE. LTD., Singapore (SG)

(72) Inventor: Kunibert Husung, Erlangen (DE)

(73) Assignee: Sivantos Pte. Ltd., Singapore (SG)

( * ) Notice: Subject to any disclaimer, the term of this patent is extended or adjusted under 35 U.S.C. 154(b) by 70 days.

(21) Appl. No.: 17/381,421

(22) Filed: Jul. 21, 2021

(65) Prior Publication Data

US 2022/0030361 A1    Jan. 27, 2022

(30) Foreign Application Priority Data

Jul. 21, 2020 (DE) ...................... 10 2020 209 123.4

(51) Int. Cl.
| | |
|---|---|
| *H04R 25/02* | (2006.01) |
| *H04R 25/00* | (2006.01) |
| *B81B 3/00* | (2006.01) |
| *G01R 33/09* | (2006.01) |
| *H04R 1/10* | (2006.01) |

(52) U.S. Cl.
CPC .......... *H04R 25/43* (2013.01); *B81B 3/0032* (2013.01); *G01R 33/098* (2013.01); *H04R 25/02* (2013.01); *B81B 2201/0257* (2013.01); *H04R 1/105* (2013.01); *H04R 2201/003* (2013.01)

(58) Field of Classification Search
CPC .......... B81B 3/0032; B81B 2201/0257; G01R 33/098; H04R 25/43; H04R 25/02; H04R 1/105; H04R 2201/003; H04R 2225/33; H04R 25/554
See application file for complete search history.

(56) References Cited

U.S. PATENT DOCUMENTS

| | | | |
|---|---|---|---|
| 10,277,992 B2 * | 4/2019 | Deak | ........................ H04W 4/80 |
| 2010/0208927 A1 | 8/2010 | Ritter et al. | |
| 2017/0215012 A1 | 7/2017 | Deak et al. | |
| 2021/0240433 A1 * | 8/2021 | Sato | ...................... A61B 5/6817 |
| 2021/0290102 A1 * | 9/2021 | Burwinkel | ............... A61B 5/162 |

FOREIGN PATENT DOCUMENTS

| | | |
|---|---|---|
| DE | 102015213110 A1 | 1/2017 |
| DE | 102017207643 A1 | 11/2018 |
| EP | 2219392 A2 | 8/2010 |
| EP | 2890155 A | 7/2015 |
| EP | 2625871 B1 | 9/2016 |
| EP | 3171615 A1 | 5/2017 |

* cited by examiner

*Primary Examiner* — Brian Ensey
(74) *Attorney, Agent, or Firm* — Laurence A. Greenberg; Werner H. Stemer; Ralph E. Locher

(57) ABSTRACT

A hearing aid has an input transducer, a signal processing device and an output transducer. Furthermore, the hearing aid has an inductive receiver, wherein the inductive receiver contains a tunnel magnetoresistance (TMR) sensor. The inductive receiver is configured to receive audio signals of an inductive hearing system. A DC voltage converter is disposed upstream of the TMR sensor, and the DC voltage converter is upstream of the input transducer.

15 Claims, 2 Drawing Sheets

HEARING DEVICE AND HEARING DEVICE MODULE

CROSS-REFERENCE TO RELATED APPLICATION

This application claims the priority, under 35 U.S.C. § 119, of German patent application DE 10 2020 209 123.4, filed Jul. 21, 2020; the prior application is herewith incorporated by reference in its entirety.

BACKGROUND OF THE INVENTION

Field of the Invention

The invention relates to a hearing device containing an input transducer, a signal processing device, an output transducer, and an inductive receiver. The invention furthermore relates to a hearing device module.

A "hearing device" typically refers to classic hearing aids that are used to care for those with hearing loss. More generally, however, this term also refers to devices that are configured to assist people with normal hearing. Such hearing aids are also referred to as "personal sound amplification products" or "personal sound amplification devices" (abbreviated to "PSAD"). These are not provided to compensate for hearing loss, but are employed in specific ways to assist and improve normal human hearing capacity in specific hearing situations, for example to assist hunters when hunting or to assist animal observation in order to be able to better perceive animal noises and other sounds generated by animals, for sports reporters to facilitate improved speech and/or speech understanding against complex background noise, for musicians in order to reduce stress on the hearing system, and so forth.

Regardless of the intended application, hearing devices typically contain an input transducer, a signal processing device which usually contains an amplifier, and an output transducer as the significant components. The input transducer is usually formed here by an acoustic-electrical transducer, i.e. for example by a microphone, and/or by an electromagnetic receiver, for example an induction coil. An electro-acoustic transducer is in most cases employed as an output transducer, for example a miniature loudspeaker (also referred to as an "earpiece"), or an electromechanical transducer, for example a bone-conduction earpiece, and the signal processing device is usually realized by an electronic circuit placed on a circuit board.

Hearing aids in which a plurality of microphones are installed as input transducers, and in which the microphones are grouped in a hearing aid module, are furthermore known. A hearing device module of this sort is also referred to as a microphone module, and is, for example, described in European patent application EP 2 219 392 A2, corresponding to U.S. Publication No. 2010/0208927.

Hearing devices are moreover known that are configured to receive audio signals from what is known as an inductive hearing system, and contain for this purpose what is known as a telephone coil (telecoil) or T-coil for short as an inductive receiver.

BRIEF SUMMARY OF THE INVENTION

Based on this, the invention has the object of specifying an advantageously configured hearing aid and an advantageously configured hearing aid module.

This object is achieved according to the invention by a hearing device with the features of the independent hearing device claim, as well as by a hearing device module with the features of the independent hearing device module claim. Preferred developments are contained in the claims that are dependent thereon. The advantages described in relation to the hearing device and preferred configurations can also be transferred analogously to the hearing device module and vice versa.

The hearing device according to the invention contains here an input transducer, a signal processing device and an output transducer. The input transducer here is typically configured as an acoustic-electrical transducer, i.e. for example as a microphone, and the output transducer is usually configured as an electro-acoustic transducer, i.e. for example as a loudspeaker or miniature loudspeaker. The hearing device further contains an inductive receiver, while the inductive receiver contains what is known as a TMR sensor.

The hearing device according to the invention is typically configured here as a hearing device of the type described at the beginning, and in particular as a classic hearing aid of the type mentioned at the beginning. The hearing device of the invention, however, typically does not comprise a telephone coil of the type mentioned at the beginning. The TMR sensor thus preferably replaces the telephone coil usually installed, and in this case the functions in the hearing aid otherwise realized by means of the telephone coil are then expediently realized with the aid of the TMR sensor.

A TMR sensor here is a sensor in which what is known as the tunnel magnetoresistance (TMR), or the TMR effect, is exploited. This kind of sensor is therefore also known as a tunnel magnetoresistive sensor.

The hearing aid is, moreover, preferably configured as what is known as a behind-the-ear (BTE) hearing aid. The hearing aid here typically contains a hearing aid housing in which the majority of the components, assemblies or elements of the hearing aid are housed, as well as an earmold and an earmold connecting element which, for example, is formed of a sound tube and which connects the earmold to the hearing device housing.

The signal processing device furthermore typically contains a circuit board, in particular an at least partially flexible or bendable circuit board with a number of electronic components. An amplifier is usually realized here with the aid of the electronic components. Depending on the variant embodiment, the signal processing device is also configured to process digital signals. In these cases, the signal processing device expediently contains an analog-to-digital converter and a digital-to-analog converter.

Regardless of this, it is expedient if the hearing device, and in particular the inductive receiver, is configured to receive signals with a frequency in the range between about 100 Hz up to about 10,000 Hz. Depending on the particular application, the hearing aid, and in particular the inductive receiver, is moreover configured to receive signals with a frequency in the range between about 0 Hz up to about 1 GHz.

The hearing device, and in particular the inductive receiver, is here typically configured for a transfer of data from an external device to the hearing device using the inductive receiver by means of alternating magnetic fields. The inductive receiver is moreover in particular configured to receive audio signals of an inductive hearing system.

Alternatively, or as an extension of this, the inductive receiver is configured as a receiver for signals of one or a plurality of remote control units. Depending on the particular application, a corresponding remote control unit is, for example, configured here for operation of the hearing aid, that is, for example, for driving the hearing device in such a way that it changes its operating mode.

The hearing device, and in particular the inductive receiver, is preferably, however, not configured to receive and process signals from another hearing device. If an exchange of data with a further hearing device is intended, the hearing device preferably contains a separate transmitting and receiving unit for this purpose.

A configuration of the hearing device in which it contains a hearing device module and in which, moreover, the inductive receiver is preferably part of the hearing device module, is furthermore preferred. A corresponding hearing device module here is usually prefabricated and installed in the context of final assembly of the hearing device. In the case of the majority of variant embodiments, the hearing device module contains here a module housing or a carrier unit for the other components, elements or assemblies of the hearing device module. The module housing or the carrier unit then typically has a number of fastening elements for mechanical fastening, as well, usually, as a number of electrical connecting elements, for example connecting contacts, for electrical connection of the hearing aid module to the further components, assemblies or elements in the hearing device, in particular for electrical connection of the hearing device module to the signal processing device.

It is also advantageous if the input transducer is part of a hearing device module and, in particular, of the hearing device module mentioned above. By accommodating the input transducer in a hearing device module a highly effective decoupling of the input transducer from the influence of structure-borne noise can, inter alia, be achieved, as is, for example, described in published, European patent application EP 2 219 392 A2, cited at the beginning, to which reference is made here explicitly in this respect.

Regardless of whether or not the input transducer is a part of a hearing device module, it preferably contains what is known as a MEMS microphone, or is constituted of one. A MEMS microphone is typically a condenser microphone with micro-system technology.

The hearing device moreover contains, depending on the particular application, at least two input transducers, typically at least two identical input transducers, and in particular at least two MEMS microphones. These are then preferably all part of a hearing device module and, in particular, of the hearing device module mentioned above. Since, however, expanding to more than one input transducer does not represent a great hurdle for the expert, for the sake of simplicity the following more detailed description always refers to hearing device embodiments that only have one input transducer.

Depending on the particular application, the hearing device also comprises at least two TMR sensors, typically at least two identical TMR sensors. These are then preferably all part of a hearing device module and, in particular, of the hearing device module mentioned above. Since, however, expanding to more than one TMR sensor does not represent a great hurdle for the expert, for the sake of simplicity the following more detailed description always refers to hearing device embodiments that only have one TMR sensor.

Also favorable is a configuration of the hearing device in which the hearing device and, in particular, a hearing device module as mentioned above contains a DC voltage converter, for example a DC voltage converter that is designed as what is known as a charge pump.

The DC voltage converter is, depending on the particular application, configured for an output voltage greater than or equal to 5 V, and, further preferably, for an output voltage greater than or equal to 6 V, i.e. for example about 7 V.

The hearing device typically here contains a battery or accumulator with a battery voltage or accumulator voltage whose value is preferably less than or equal to 4.5 V, further preferably less than or equal to 4 V and, in particular, less than or equal to 3.5 V.

Regardless of this, what is known as the DC voltage converter is preferably designed for a maximum output current greater than or equal to 10 µA, further preferably greater than or equal to 30 µA and, in particular, greater than or equal to 50 µA, i.e., for example, about 100 µA.

Depending on the variant embodiment, the DC voltage converter is furthermore upstream of the TMR sensor. In this case, the DC voltage converter then expediently serves to supply the TMR sensor with electrical energy when the hearing aid is operating. The output voltage in this case is then preferably configured for the value that is provided for operation of the TMR sensor, and this is preferably independent of whether or not the DC voltage converter is in addition provided for the supply of further components, assemblies or elements.

A configuration of the hearing device is furthermore preferred in which the DC voltage converter is upstream of the input transducer, in particular when the input transducer is configured as a MEMS microphone as mentioned above.

An embodiment of the hearing device in which it contains a hearing device module as mentioned above and in which the TMR sensor, the input transducer, i.e. in particular, the MEMS microphone, as well as the DC voltage converter are part of the hearing device module, is in particular preferred here. In an embodiment of this sort, it is then further preferred for the DC voltage converter to be upstream of the TMR sensor on the one hand and of the input transducer, in particular of the MEMS microphone, on the other. In such a case, the DC voltage converter then preferably serves both to supply the TMR sensor and to supply the input transducer with electrical energy when the hearing device is operating.

An embodiment of the hearing device in which it, as previously indicated, contains a hearing device housing with a front end and with a rear end located opposite is, furthermore, typical. A connection for an earmold connecting element to an earmold of the hearing device is usually in this case positioned at the front end. Depending on the variant embodiment, the output transducer is here located in the hearing device housing, wherein, in this case, the earmold connecting element is typically then formed as a sound tube, or the output transducer is located in the earmold, wherein, in this case, an electrical connection is typically then formed to the earmold. Regardless of this, a hearing device module as mentioned above is preferably provided and, in this case, the hearing device module is, further preferably, arranged in the region of the front end of the hearing device housing.

Other features which are considered as characteristic for the invention are set forth in the appended claims.

Although the invention is illustrated and described herein as embodied in a hearing device and a hearing device module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Parts corresponding to one another are each given the same reference signs in all the figures.

Figure 1:
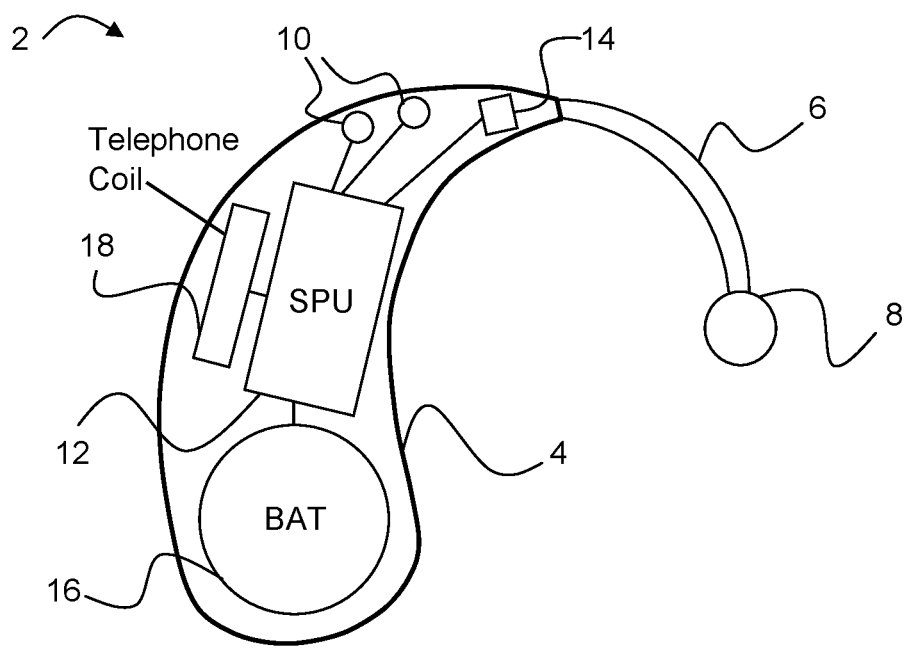
FIG. 1 is an illustration showing a sketch of a principle of a structure of a hearing device according to the prior art.

Referring now to the figures of the drawings in detail and first, particularly to FIG. 1 thereof, there is shown a first reproduction of a basic structure of a hearing device 2 according to the prior art. The hearing device 2 contains a hearing aid housing 4 that is connected to an earmold 8 via a sound tube 6. The corresponding hearing device 2 is thus configured as what is known as a behind-the-ear (BTE) hearing aid. Two microphones 10, a signal processing device 12, a loudspeaker 14 and an accumulator 16 are installed as the important components in the hearing device housing 4. In addition, the hearing aid 2 also has what is known as a telephone coil 18 as an inductive receiver.

Figure 2:
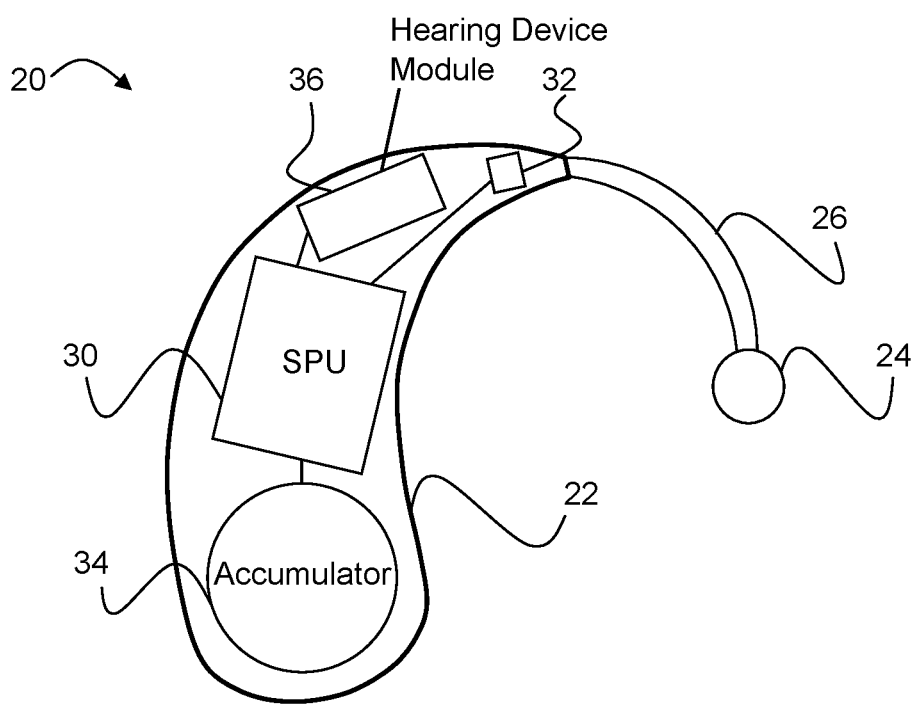
FIG. 2 is an illustration of a principle of a structure of a hearing device according to the invention with a hearing device module according to the invention.
Figure 3:
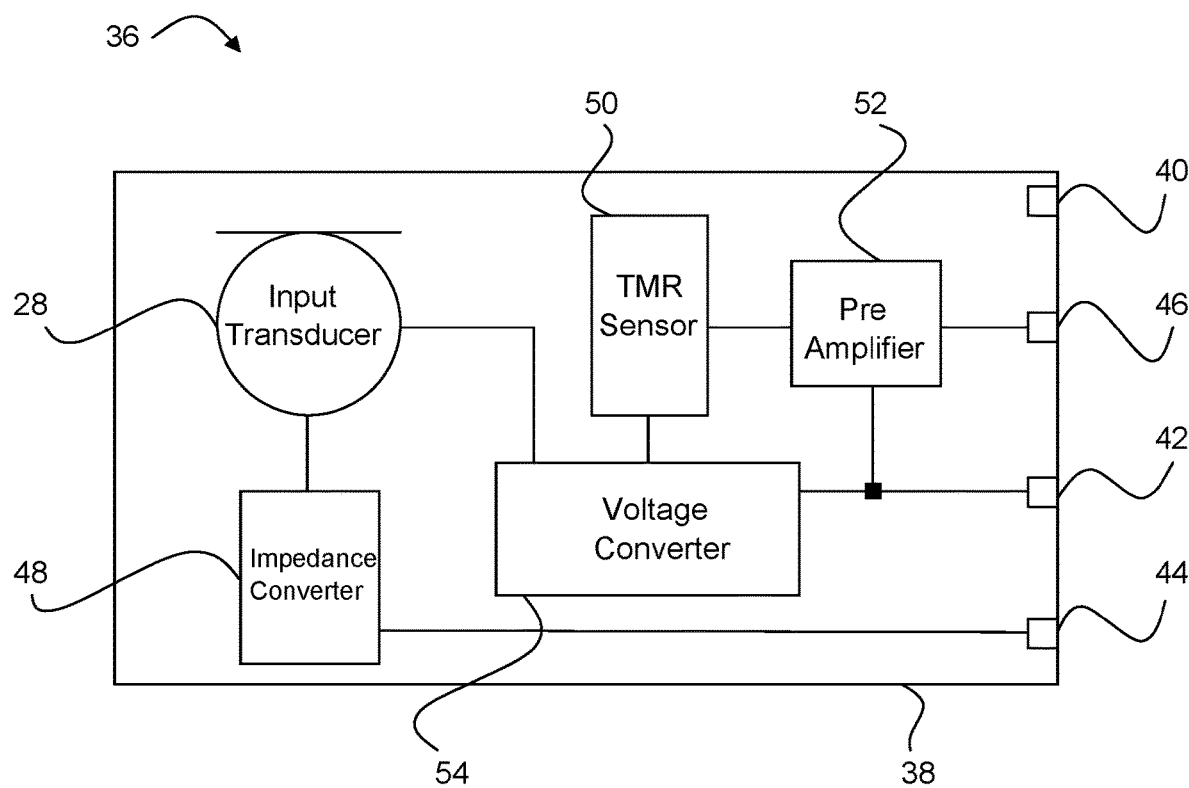
FIG. 3 is a block diagram of the principle of the hearing aid module according to the invention.

A variant embodiment of a hearing device 20 according to the invention is illustrated in FIG. 2 and FIG. 3. The hearing aid 20, as is shown in FIG. 2, is also configured as what is known as a behind-the-ear (BTE) hearing aid, and contains a hearing aid housing 22, an earmold 24, and a sound tube 26, while the sound tube 26 connects the earmold 24 to the hearing aid housing 22. The hearing aid 20 also contains, as important components, a microphone that is configured as a MEMS microphone 28, as well as a signal processing device 30, a loudspeaker 32 and an accumulator 34.

The microphone here is part of a hearing aid module 36 that is illustrated in more detail in FIG. 3. The hearing aid module 36 in the exemplary embodiment contains a module housing 38 in which the other components of the hearing aid module 36 are arranged. The hearing aid module 36 here is typically prefabricated and installed in the context of final assembly of the hearing aid 20. The module housing 38 usually contains for this purpose a number of fastening elements, not illustrated in more detail, for mechanical fastening, as well as a number of electrical connecting elements for electrically connecting the hearing aid module 36 to the signal processing device 30.

In the exemplary embodiment, the number of electrical connecting elements consists of four connecting contacts 40 to 46. A first connecting contact 40 here serves to specify a ground potential or reference potential for the hearing aid module 36 when the hearing aid 20 is operating, and a second connecting contact 42 for the provision of a supply voltage for the hearing aid module 36 when the hearing aid 20 is operating, wherein the ground potential or reference potential and the supply voltage are supplied in the exemplary embodiment via the signal processing device 30, and are fed from the accumulator 34. For the sake of simplicity the further provision of the ground potential or reference potential to individual components of the hearing aid module 36 is not shown in FIG. 3.

A third connecting contact 44 serves to pass microphone signals generated by means of the MEMS microphone 28 on to the signal processing device 30 when the hearing aid 20 is operating, wherein, in the exemplary embodiment, the third connecting contact 44 is connected to the MEMS microphone 28 via an impedance converter 48.

The fourth connecting contact 46 finally serves to pass receiver signals on to the signal processing device 30 when the hearing aid 20 is operating. Corresponding receiver signals are here generated when the hearing aid 20 is operating with the aid of an inductive receiver which is part of the hearing aid module 36, and which is configured as a TMR sensor 50. A preamplifier 52 is here positioned in the exemplary embodiment between the TMR sensor 50 and the fourth connecting contact 46, and is also part of the hearing aid module 36. In the exemplary embodiment, the inductive receiver serves to receive audio signals of an inductive hearing system.

In the exemplary embodiment, the hearing aid module 36 further contains a DC voltage converter 54, that is in particular configured as what is known as a charge pump. In the exemplary embodiment, this DC voltage converter 54 is upstream of both the microphone 28 and of the inductive receiver, and thereby supplies both the inductive receiver and the microphone 28 with electrical power when the hearing aid 20 is operating.

A hearing aid module 36 according to the invention preferably does not comprise any further and/or additional electrical and/or electronic assemblies and/or components. A hearing aid module 36 according to the invention preferably does not comprise an analog-to-digital converter. A hearing aid module 36 according to the invention furthermore preferably does not comprise a digital-to-analog converter. In particular, a hearing aid module 36 according to the invention does not comprise a unit for processing digital signals.

The following is a summary list of reference numerals and the corresponding structure used in the above description of the invention:

2 Hearing aid (Prior art)
4 Hearing aid housing
6 Sound tube
8 Earmold
10 Microphone
12 Signal processing device
14 Loudspeaker
16 Accumulator
18 Telephone coil
20 Hearing aid
22 Hearing aid housing
24 Earmold
26 Sound tube
28 MEMS microphone
30 Signal processing device
32 Loudspeaker
34 Accumulator
36 Hearing aid module
38 Module housing
40 First connecting contact
42 Second connecting contact
44 Third connecting contact
46 Fourth connecting contact
48 Impedance converter
50 TMR sensor
52 Preamplifier
54 DC voltage converter

The invention claimed is:

1. A hearing device, comprising:
   an input transducer;
   a signal processor;
   an output transducer;
   an inductive receiver having a tunnel magnetoresistance (TMR) sensor, said inductive receiver being configured to receive audio signals of an inductive hearing system; and
   a DC voltage converter disposed upstream of said TMR sensor, and said DC voltage converter being upstream of said input transducer.

2. The hearing device according to claim 1, wherein said inductive receiver is configured to receive signals with a frequency in a range between 100 Hz and 10,000 Hz.

3. The hearing device according to claim 1, wherein said input transducer contains a micro-electro-mechanical system (MEMS) microphone.

4. The hearing device according to claim 1, wherein said DC voltage converter is configured for an output voltage greater than or equal to 5 V.

5. The hearing device according to claim 1, wherein said DC voltage converter is configured for a maximum output current greater than or equal to 10 µA.

6. The hearing device according to claim 1, wherein:
   said input transducer includes a micro-electro-mechanical system microphone;
   said DC voltage converter is configured for an output voltage greater than or equal to 6 V; and
   said DC voltage converter is configured for a maximum output current greater than or equal to 50 µA.

7. The hearing device according to claim 1, further comprising a hearing device module, said inductive receiver is part of said hearing device module.

8. The hearing device according to claim 7, wherein said input transducer is part of said hearing device module.

9. The hearing device according to claim 7, wherein said DC voltage converter is part of said hearing device module.

10. The hearing device according to claim 7, further comprising a hearing aid housing with a front end, at which a connection for an earmold connecting element is positioned, and with a rear end disposed opposite, and that said hearing device module is disposed in a region of said front end in said hearing aid housing.

11. The hearing device according to claim 9, further comprising a hearing aid housing with a front end, at which a connection for an earmold connecting element is positioned, and with a rear end disposed opposite, and that said hearing device module is disposed in a region of said front end in said hearing aid housing.

12. The hearing device according to claim 1,
   wherein said input transducer has a micro-electro-mechanical system (MEMS) microphone;
   wherein said DC voltage converter is configured for an output voltage greater than or equal to 6 V;
   wherein said DC voltage converter is configured for a maximum output current greater than or equal to 50 µA;
   further comprising a hearing device module, and that said inductive receiver is part of said hearing device module;
   wherein said input transducer is part of said hearing device module;
   wherein said DC voltage converter is part of said hearing device module;
   further comprising a hearing aid housing with a front end, at which a connection for an earmold connecting element is positioned, and with a rear end disposed opposite; and
   said hearing device module is disposed in a region of said front end in said hearing aid housing.

13. A hearing device module configured for the hearing device according to claim 6, the hearing device module comprising:
   said inductive receiver.

14. The hearing device module according to claim 13, further comprising said input transducer.

15. The hearing device module according to claim 14, further comprising said DC voltage converter.

* * * * *